(12) United States Patent
Zushi et al.

(10) Patent No.: US 8,916,882 B2
(45) Date of Patent: Dec. 23, 2014

(54) SWITCHING CIRCUIT AND SEMICONDUCTOR MODULE

(75) Inventors: Yusuke Zushi, Tokyo (JP); Yoshinori Murakami, Yokohama (JP); Satoshi Tanimoto, Yokohama (JP); Shinji Sato, Niiza (JP); Kohei Matsui, Tsukuba (JP)

(73) Assignees: Nissan Motor Co., Ltd., Yokohama-shi (JP); Sanken Electric Co., Ltd., Niiza-shi (JP); Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/116,890

(22) PCT Filed: May 11, 2012

(86) PCT No.: PCT/JP2012/062129
§ 371 (c)(1),
(2), (4) Date: Nov. 11, 2013

(87) PCT Pub. No.: WO2012/153836
PCT Pub. Date: Nov. 15, 2012

(65) Prior Publication Data
US 2014/0091324 A1    Apr. 3, 2014

(30) Foreign Application Priority Data

May 12, 2011  (JP) .................................. 2011-107171
Sep. 14, 2011  (JP) .................................. 2011-200308

(51) Int. Cl.
| H03K 17/16 | (2006.01) |
| H01L 27/06 | (2006.01) |
| H02M 1/08  | (2006.01) |

(52) U.S. Cl.
CPC ............. *H01L 27/0629* (2013.01); *H02M 1/08* (2013.01); *H03K 17/166* (2013.01); *H01L 27/0682* (2013.01)
USPC .......................................................... 257/77

(58) Field of Classification Search
CPC ............................... H02M 1/08; H03K 17/166
USPC ........................................................ 257/76, 77
See application file for complete search history.

(56) References Cited

FOREIGN PATENT DOCUMENTS

| JP | 6-053796 A    | 2/1994  |
| JP | 2000-333441 A | 11/2000 |
| JP | 2003-061335 A | 2/2003  |
| JP | 2003-324966 A | 11/2003 |

OTHER PUBLICATIONS

Robin Kelley et al., Optimized Gate Driver for Enhancement-mode SiC JFET, PCIM Europe 2009, May 12-14, 2009, 6 pages.

*Primary Examiner* — Thomas L Dickey
(74) *Attorney, Agent, or Firm* — Foley & Lardner LLP

(57) ABSTRACT

A switching circuit includes: a first switching element (Q1); a resistor (11) inserted between a control electrode (G) of the first switching element (Q1) and a control circuit (13) switching the first switching element (Q1); and a first capacitor (15) and a second switching element (14) connected in series between the control electrode (G) of the first switching element (Q1) and a low potential-side electrode (S) of the first switching element (Q1). A high potential-side electrode of the second switching element (14) is connected to the control electrode (G) of the first switching element (Q1). An electrode of the first capacitor (15) is connected to the low potential-side electrode (S) of the first switching element (Q1). A control electrode of the second switching element (14) is connected to an electrode of the resistor (11) connected to the control circuit (13).

10 Claims, 14 Drawing Sheets

SWITCHING CIRCUIT AND SEMICONDUCTOR MODULE

TECHNICAL FIELD

The present invention relates to a switching circuit and a semiconductor module.

BACKGROUND ART

An inverter circuit using a SiC device is known, which: includes a capacitor inserted between the gate and the source of a junction field effect transistor serving as a main switching element; and thus prevents false triggering by suppressing a rising change in the voltage between the gate and the source during a rise in the voltage between the drain and the source.

CITATION LIST

Non Patent Literature

Non-patent Literature 1: Robin Kelley, SemiSouth, USA, "Optimized Gate Driver for Enhancement-Mode SiC JFET Used in 480VAV SMPS and 1 kV PV-Inverters," PCIM Europe 2009, 12-14 May 2009, Nuremberg

SUMMARY OF INVENTION

However, the above-mentioned inverter circuit has a problem that load on a gate driver circuit is increased because charge and discharge currents for charging and discharging the capacitor have to be supplied from the gate driver circuit in order to control the switching of the main switching element.

A problem to be solved by the present invention is to provide a switching circuit and a semiconductor module which reduce the load on the control circuit for controlling the switching.

A switching circuit according to one aspect of the present invention includes: a first switching element; a resistor inserted between a control electrode of the first switching element and a control circuit configured to perform switching control on the first switching element; and a first capacitor and a second switching element connected between the control electrode of the first switching element and a low potential-side electrode of the first switching element. A high potential-side electrode of the second switching element is connected to the control electrode of the first switching element. A low potential-side electrode of the second switching element is connected to one electrode of the first capacitor. The other electrode of the first capacitor is electrically connected to the low potential-side electrode of the first switching element. A control electrode of the second switching element is connected to an electrode of the resistor connected to the control circuit.

DESCRIPTION OF EMBODIMENTS

Descriptions will be hereinbelow provided for the embodiments of the present invention on the basis of the drawings.

First Embodiment

Figure 1:
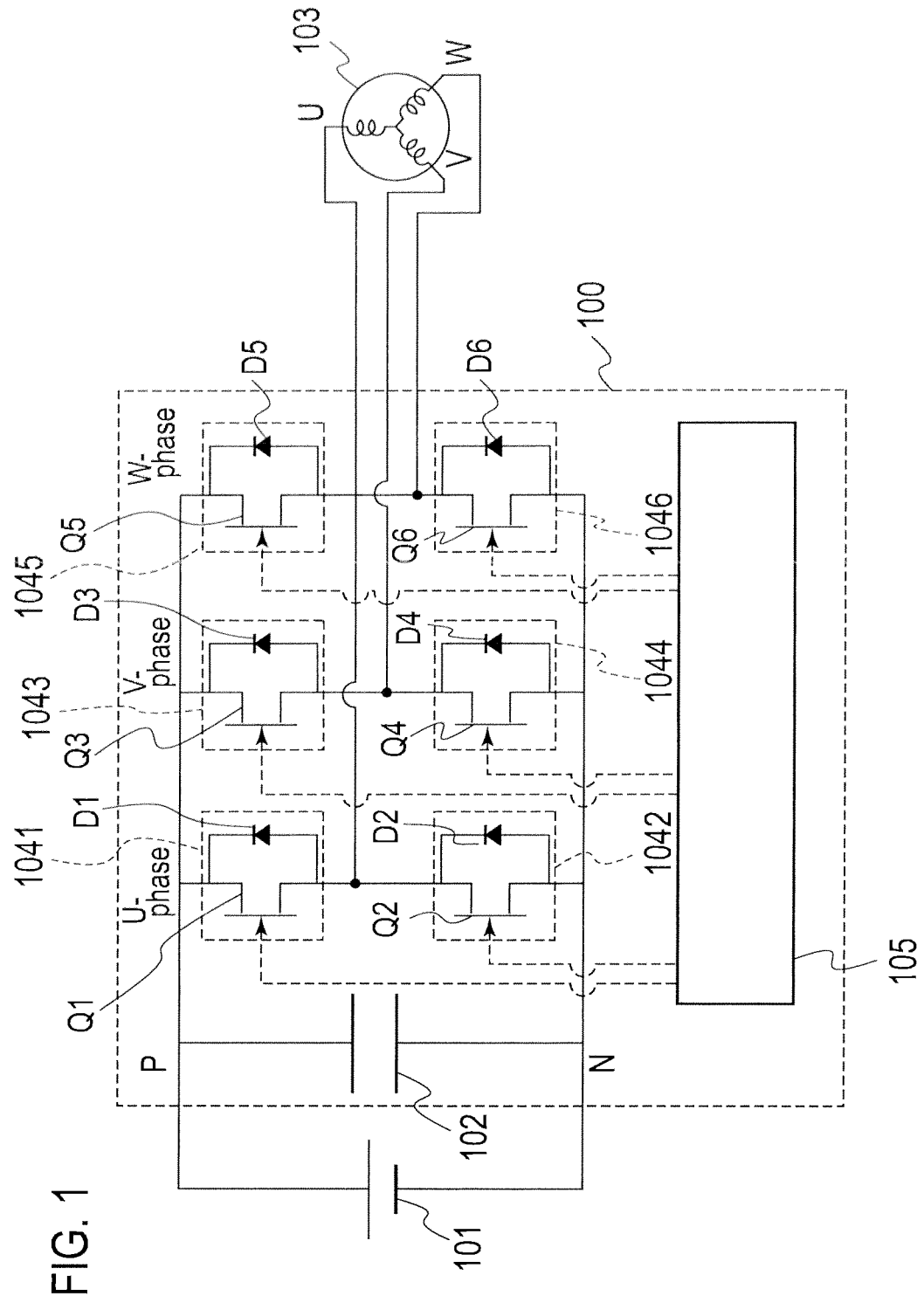
FIG. 1 is a block diagram showing a DC to three-phase AC converter which employs a switching circuit of the present invention.

FIG. 1 is a block diagram showing a DC to three-phase AC converter which includes a switching circuit of the present invention. Although its detailed illustration is omitted, a power converter including the switching circuit of the present invention is applied to an AC uninterruptible power system, a general-purpose inverter for rotating an induction machine, and the like.

The DC to three-phase AC converter including the switching circuit of the present invention includes: a three-phase AC load 103; a DC power source 101; and an inverter 100 configured to convert the DC power of the DC power source 101 into AC power.

The DC power source 101 is formed from, for example, a solar battery, a fuel cell, a PFC converter, or a secondary battery such as a lithium-ion battery. It should be noted that when the AC load 103 performs regenerative operation, the AC power of the AC load 103 is converted into DC power by the inverter 100, and the resultant DC power is inputted to the DC power source 101.

The inverter 100 includes: upper arm circuits 1041, 1043, 1045; lower arm circuits 1042, 1044, 1046; a smoothing capacitor 102; and a controller 105. The inverter 100 converts the DC power of the DC power source 101 into the AC power, and supplies the AC power to the AC load 103. Main configurations of the upper arm circuits 1041, 1043, 1045 are circuits in which switching elements Q1, Q3, Q5 as power devices and diodes D1, D3, D5 are connected together in parallel, respectively. Similarly, main configurations of the lower arm circuits 1042, 1044, 1046 are circuits in which switching elements Q2, Q4, Q6 as power devices and diodes D2, D4, D6 are connected together in parallel, respectively. In this embodiment, three pairs of circuits, that is to say, three circuits each including serially connected pairs of the switching elements, namely, Q1 and Q2, Q3 and Q4, and Q5 and Q6, are connected between power source lines P, N, and are thereby connected to the DC power source 101 in parallel. A connecting point between each paired switching elements is electrically connected to a corresponding one of the three-phase input portions of the AC load 103. For example, any of a junction field effect transistor (JFET), a metal-oxide semiconductor field effect transistor (MOSFET) and an insulated gate bipolar transistor (IGBT), each of which is a wide gap semiconductor device (a SiC device, a GaN device or a diamond device) or a Si device, is used as each of the switching elements Q1 to Q6. Any of a FRD (Fast Recovery Diode), a SBD (Schottky Barrier Diode) and the like is used as each of the diodes D1 to D6.

In the example shown in FIG. 1, the upper arm circuit 1041 and the lower arm circuit 1042 are paired and connected together in series; the upper arm circuit 1043 and the lower arm circuit 1044 are paired and connected together in series; and the upper arm circuit 1045 and the lower arm circuit 1046 are paired and connected together in series. The connecting point between the upper arm circuit 1041 and the lower arm circuit 1042 is connected to the U-phase of the AC load 103; the connecting point between the upper arm circuit 1043 and the lower arm circuit 1044 is connected to the V-phase of the AC load 103; and the connecting point between the upper arm circuit 1045 and the lower arm circuit 1046 is connected to the W-phase of the AC load 103. The upper and lower arm circuits 1041 to 1046 are switched at a high frequency under the control of the controller 105. The controller 105 controls the output from the inverter 100 by putting the upper and lower circuits 1041, 1042 into on and off states almost in a complementary fashion.

The upper arm circuit 1041 is formed from the switching element Q1, the diode D1 and a gate driver circuit which will be described later. In a case where, for example, the switching element Q1 is formed from a unipolar transistor, its drain electrode is connected to a cathode terminal of the diode D1, and a source electrode of the switching element Q1 is connected to an anode terminal of the diode D1. A gate electrode of the switching element Q1 is connected to the controller 105 through the gate driver circuit to be described later. Similarly, the other upper and lower arm circuits 1042 to 1046 are connected to the controller 105.

Figure 2:
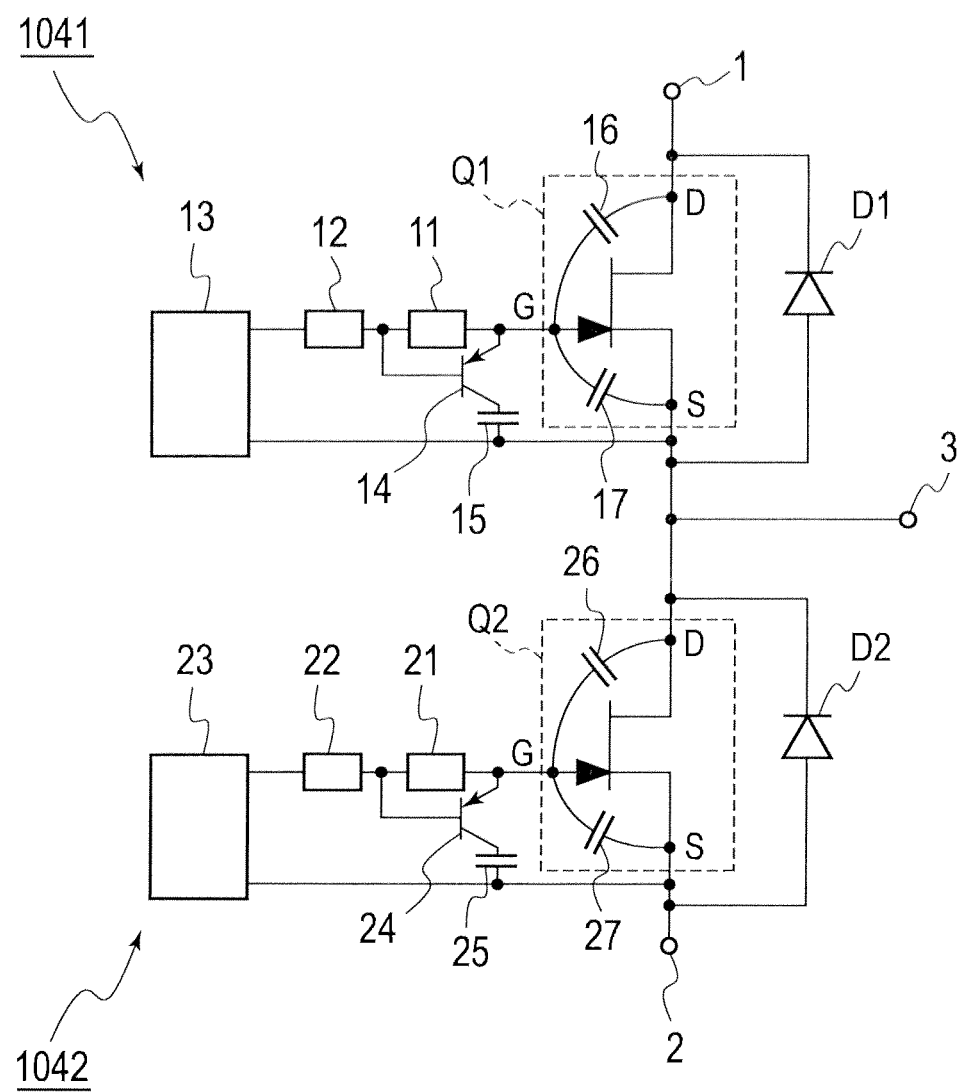
FIG. 2 is a circuit diagram related to FIG. 1, showing upper and lower arm circuits which correspond to one of the three phases shown in FIG. 1.

Next, using FIG. 2, descriptions will be provided for detailed circuit configurations of the upper and lower arm circuits 1041, 1042 which correspond to the switching circuit of the embodiment. FIG. 2 is a circuit diagram of a circuit in the U-phase which is extracted from the inverter 100 shown in FIG. 1. It should be noted that the circuit configurations of the upper and lower arm circuits 1043, 1044, and the circuit configurations of the upper and lower arm circuits 1045, 1046 are the same as the circuit configurations of the upper and lower arm circuits 1041, 1042. For this reason, descriptions for them will be omitted.

The upper arm circuit 1041 includes the switching element Q1, the diode D1, a gate resistor 11, a gate impedance 12, a gate driver circuit 13, a switching element 14 and a capacitor 15. The lower circuit 1042 includes the switching element Q2, the diode D2, a gate resistor 21, a gate impedance 22, a gate driver circuit 23, a switching element 24 and a capacitor 25. The switching element Q1 has a feedback capacitance 16 between the drain and the gate, and an input capacitance 17 between the gate and the source. The switching element Q2 has a feedback capacitance 26 between the drain and the gate, and an input capacitance 27 between the gate and the source. The feedback capacitances 16, 26 and the input capacitances 17, 27 are parasitic capacitances existing inside the switching elements Q1, Q2, respectively.

A positive electrode terminal 1 is connected to the positive electrode of the DC power source 101, and a negative electrode terminal 2 is connected to the negative electrode of the DC power source 101. An AC terminal 3 is drawn from the connecting point between the source electrode of the switching element Q1 and the drain electrode of the switching element Q2, and is connected to the U-phase of the AC load 103.

Of the three terminals of the switching element Q1, the drain electrode which is a high-potential-side electrode is connected to the positive electrode terminal 1; the source electrode which is a low-potential-side electrode is connected to the AC terminal 3 and the drain electrode of the switching element Q2; and the gate electrode which is the control electrode is connected to the gate resistor 11. The gate resistor 11 is a resistor configured to prevent parasitic oscillation of the switching element Q1, and one end of the gate resistor 11 is connected to the gate electrode of the switching element Q1. The gate impedance 12 is equivalent to the internal impedance of the gate driver circuit 13 and a wiring impedance, and is an impedance whose main component is a wiring inductance.

The gate driver circuit 13 is a driver circuit configured to control the operation of the switching element Q1 by giving its output to the gate terminal of the switching element Q1 on the basis of a control signal from the controller 105 shown in FIG. 1. A signal feedback line of the gate driver circuit 13 is connected to the lower-potential-side electrode of the switching element Q1.

The switching element 14 is a PNP transistor. The emitter electrode of the switching element 14 is connected between the gate electrode of the switching element Q1 and the one end of the gate resistor 11; the collector electrode of the switching element 14 is connected to one end of the capacitor 15; and the base electrode of the switching element 14 is connected to the other end of the gate resistor 11. The one end of the capacitor 15 is connected to the collector electrode of the switching element 14, and the other end of the capacitor 15 is connected to the source electrode S of the switching element Q1. In short, the switching element 14 and the capacitor 15 which are connected together in series are connected between the gate and the source of the switching element Q1.

Of the three terminals of the switching element Q2, the drain electrode which is a high-potential-side electrode is connected to the source electrode of the switching element Q1 and the AC terminal 3; the source electrode which is a low-potential-side electrode is connected to the negative electrode 2; and the gate electrode which is a control electrode is connected to the gate resistor 21. The gate resistor 21 is a resistor configured to prevent parasitic oscillation of the switching element Q2, and one end of the gate resistor 21 is connected to the gate electrode of the switching element Q2. The gate impedance 22 is equivalent to the internal impedance of the gate driver circuit 23 and a wiring impedance, and is an impedance whose main component is a wiring inductance.

The gate driver circuit 23 is a driver circuit configured to control the switching of the switching element Q2 by inputting a gate voltage to the gate electrode on the basis of a control signal from the controller 105. The gate driver circuit 23 is connected to the negative electrode terminal 2.

The switching element 24 is a PNP transistor. The emitter electrode of the switching element 24 is connected between the gate electrode of the switching element Q2 and the one end of the gate resistor 21; the collector electrode of the switching element 24 is connected to one end of the capacitor 25; and the base electrode of the switching element 24 is connected between the other end of the gate resistor 21 and an output terminal of the gate driver circuit 23. The one end of the capacitor 25 is connected to the collector electrode of the switching element 24, and the other end of the capacitor 25 is connected to the source electrode S of the switching element Q2. In short, the switching element 24 and the capacitor 25 are connected together in series, and the series circuit including the switching element 24 and the capacitor 25 is connected between the gate and the source of the switching element Q2.

Each of the gate driver circuits 13, 23 outputs an appropriate positive voltage when the corresponding control signal to it from the controller 105 shown in FIG. 1 is an ON instruction, and outputs an appropriate negative voltage when the corresponding control signal is an OFF instruction.

Each of the switching elements Q1, Q2 enters an ON state and its drain and source are conducted with each other when the voltage between the gate and the source exceeds a threshold voltage. Each of the switching elements Q1, Q2 enters an OFF state and its drain and source are disconnected when the voltage between the gate and the source is below the threshold voltage. The threshold voltage is a voltage inherent to each device, and is used for switching each of the switching elements Q1 Q2 between the ON state and the OFF state. In the case of the ON instruction, each of the gate driver circuits 13, 23 supplies the positive voltage which is sufficiently higher than the threshold voltage. In the case of the OFF instruction, each of the gate driver circuits 13, 23 supplies the negative voltage which is sufficiently lower than the threshold voltage. In other words, each of the switching elements Q1, Q2 turns off from the ON state to the OFF state when the voltage between the gate and the source is switched from the voltage higher than the threshold voltage to the voltage lower than the threshold voltage.

Figure 3:
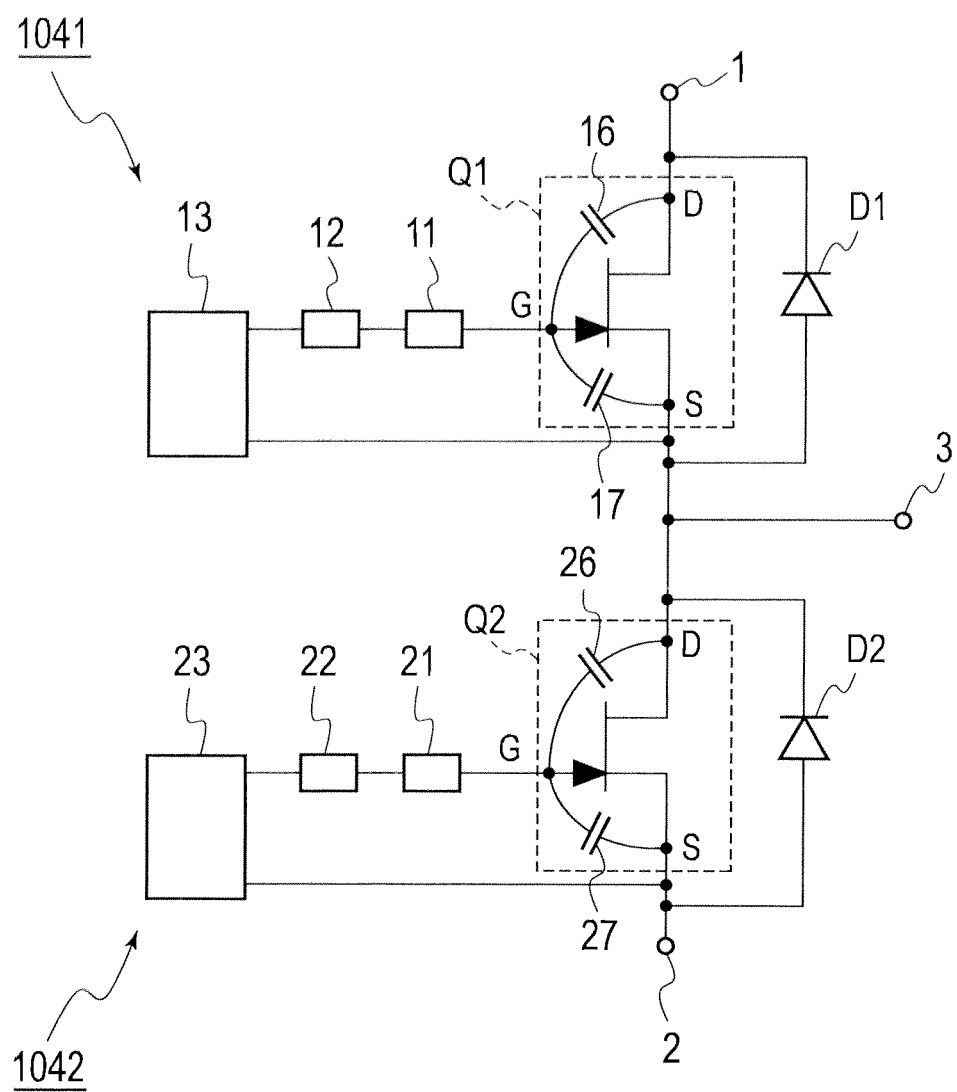
FIG. 3 is a circuit diagram for explaining a first comparative example, showing upper and lower arm circuits which correspond to one phase.
Figure 4:
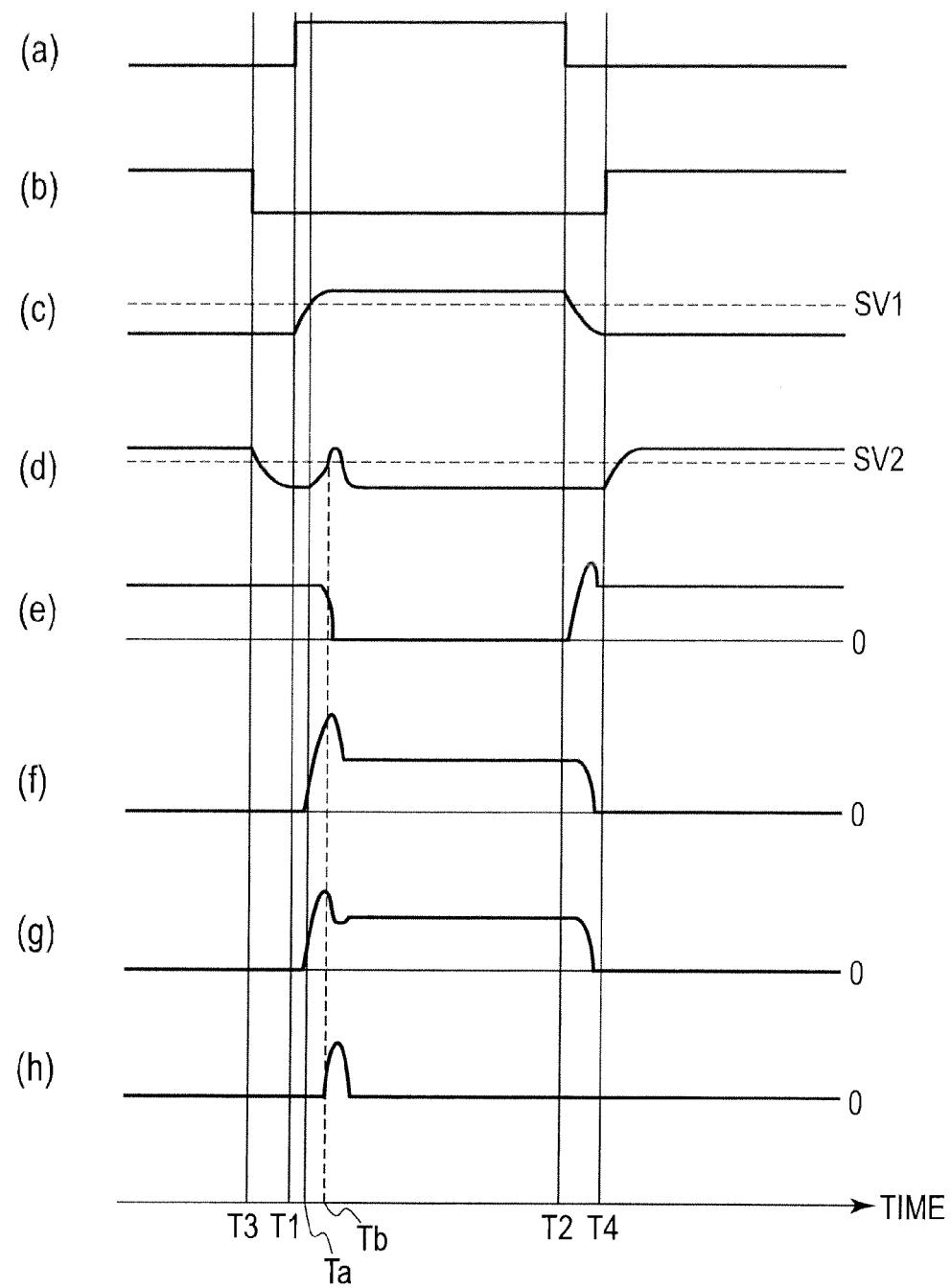
FIGS. 4(a) to 4(h) are graphs showing time characteristics of voltages and currents in the upper and lower arm circuits of the first comparative example.

Here, using FIG. 3 and FIG. 4, descriptions will be provided for the false triggering which is the problem to be solved by the present invention. FIG. 3 shows a circuit diagram of a switching circuit of a first comparative example, which corresponds to one arm in the U-phase shown in FIG. 1. FIG. 4 shows waveforms of voltages and currents in the circuit shown in FIG. 3. FIG. 4(*a*) shows the waveform of an output voltage from the gate driver circuit 13; FIG. 4(*b*) shows the waveform of an output voltage from the gate driver circuit 23; FIG. 4(*c*) shows the waveform of a voltage between the gate and the source of a switching element Q1; FIG. 4(*d*) shows the waveform of a voltage between the gate and the source of a switching element Q2; FIG. 4(*e*) shows the waveform of a voltage between the drain and the source of the switching element Q1; FIG. 4(*f*) shows the waveform of a drain current of the switching element Q1; FIG. 4(*g*) shows the waveform of a voltage between the drain and the source of the switching element Q2; and FIG. 4(*h*) shows the waveform of a drain current of the switching element Q2. The timings of the illustrated waveforms are synchronized with one another. Here, the direction of each load current outputted to the AC terminal 3 in FIG. 3 is defined such that the direction in which the current is outputted from the AC terminal is positive.

As shown in FIG. 3, in the switching circuit of the first comparative example, the series circuit including the switching element 14 and the capacitor 15 is not connected between the gate and the source in either of the switching elements Q1, Q2, unlike in the switching circuit of the embodiment. As shown in FIG. 4, the gate driver circuit 13 outputs a positive pulse in an ON period from time T1 to time T2, and the gate driver circuit 23 outputs a positive pulse in an ON period on and before time T3 and in an ON period on and after time T4. After the positive pulse is outputted from the gate driver circuit 13 at the time T1, the voltage between the gate and the source of the switching element Q1 gradually rises in response to the progress in charge of an input capacitance 17. During this time, each of the output from the gate driver circuit 23 and the voltage between the gate and the source of the switching element Q2 is a negative voltage.

At time Ta, because the voltage between the gate and the source of the switching element Q1 reaches the threshold voltage, the switching element Q1 turns on from the OFF state to the ON state, and the drain current starts to flow in the switching element Q1. Accordingly, the voltage between the drain and the source of the switching element Q1 drops. In response to the drop in the voltage between the drain and the source of the switching element Q1, the voltage between the drain and the source of the switching element Q2 rises.

At the time Ta, migration of charges occurs in a passage passing through the feedback capacitance 26 and the input capacitance 27 due to the rise in the voltage between the drain and the source of the switching element Q2. Accordingly, the voltage between the gate and the source of the switching element Q2 rises. The rise in the voltage between the gate and the source of the switching element Q2 becomes higher as a build-up rate (dv/dt) of the voltage between the drain and the source of the switching element Q2 becomes larger, and as the value obtained by dividing the capacitance of the feedback capacitance 26 by the capacitance of the input capacitance 27 (the capacitance of the feedback capacitance 26/the capacitance of the input capacitance 27) becomes larger. In addition, it is more likely that: at time Tb, the voltage between the gate and the source of the switching element Q2 becomes higher than the threshold voltage; and the switching element Q2 falsely turns on against the control signal from the controller 105. In this case, since the switching element Q1 is in the ON state, a short circuit occurs between the positive terminal 1 and the negative terminal 2, and excessive electrical stress is applied to the switching elements Q1, Q2. Particularly in a case where a SiC device is used as each of the switching elements Q1 to Q6, the device operates faster and the build-up rate (dv/dt) of the voltage between the drain and the source is larger than in a case of using a different semiconductor device (such as a Si device) as each of the switching elements Q1 to Q6. Moreover the capacitances of the feedback capacitances 16, 26 are larger in this case. For this reason, the false triggering is more likely to occur.

A circuit configuration intended to increase the virtual capacitance (input capacitance) between the gate and the source in each of the switching elements Q1, Q2 shown in FIG. 3, for example, by additionally connecting a capacitor between the gate and the source has been known as a circuit configuration configured to prevent false triggering. This can make the capacitance of the input capacitance 27 larger than the capacitance of the feedback capacitance 26, thereby making the false triggering less likely to occur. However, this circuit configuration has a problem that a load on each of the gate driver circuit 13, 23 is increased because, in this circuit configuration, the added capacitors need to be charged and discharged at every switching operation. In addition, the addition of the capacitor makes a change in the waveform of the gate signal blunt when the switching is controlled, and accordingly makes the switching speeds of the switching elements Q1 to Q6 become slower. For these reasons, this circuit configuration also has problems of more delay in time during the switching operation and an increase in switching loss.

In addition, a circuit configuration in which only a PNP transistor is connected between the gate and the source of each of the switching elements Q1 to Q6 has been known as another circuit configuration configured to prevent the false triggering (see Japanese Patent Application Publication No. 2003-324966). When the voltage between the gate and the source of each of the switching elements Q1 to Q6 rises, this circuit configuration turns on the PNP transistor. Thereby, this circuit configuration is capable of making the voltage between the gate and the source equivalent to zero and thus preventing the false triggering in each of the switching elements Q1 to Q6. However, in a case where a semiconductor device whose threshold voltage is a low or negative voltage is used as each of the switching elements Q1 to Q6 in this circuit configuration, the voltage between the gate and the source rises by the voltage drop of the PNP transistor even if the PNP transistor is ON. As a result, this circuit configuration falsely turns on the switching elements Q1 to Q6. In short, this circuit configuration cannot be applied to the switching circuit using the wide gap semiconductor devices whose threshold voltage is a low or negative voltage.

In this embodiment, as described above, the series circuit including the corresponding one of the switching elements 14, 24, as the PNP transistor, and the corresponding one of the capacitors 15, 25 is connected between the gate and the source in each of the switching elements Q1 to Q6. In addition, the base electrode of each of the switching elements 14, 24 is connected between the corresponding one of the gate resistors 11, 21 and the corresponding one of the gate driver circuits 13, 23. For these reasons, the switching element 24 turns on when the voltage between the gate and the source of the switching element Q2 rises in response to the turning on of the switching element Q1, and the capacitor 25 accordingly becomes connected between the gate and the source of the switching element Q2. The charging voltage of the capacitor 25 is capable of suppressing the rise in the voltage between the gate and the source of the switching element Q2, and concurrently of applying a negative bias between the gate and the source of the switching element Q2. Accordingly, it is possible to prevent the switching element Q2 from falsely turning on.

Figure 5:
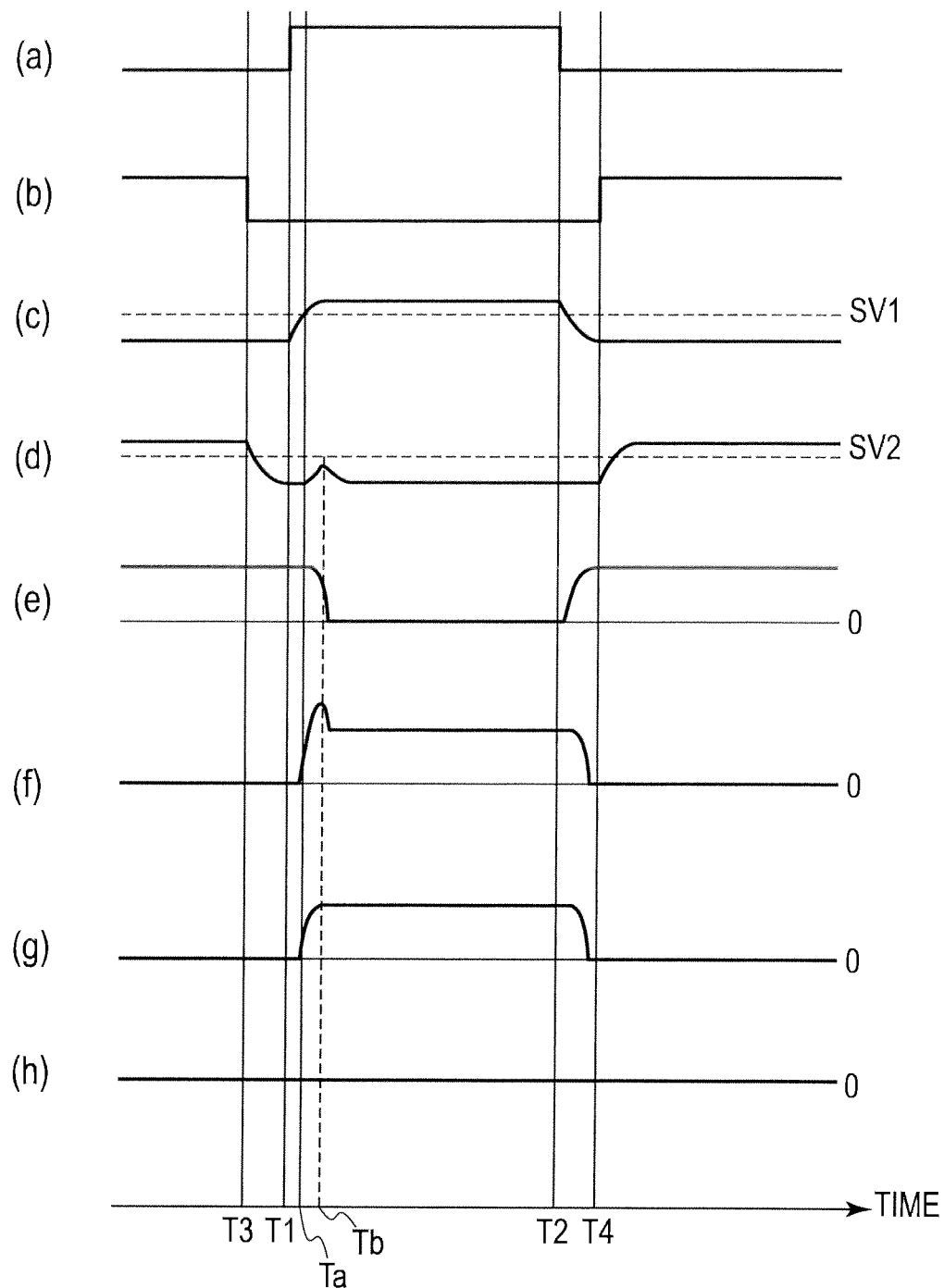
FIGS. 5(a) to 5(h) are graphs showing time characteristics of voltages and currents in the upper and lower arm circuits shown in FIG. 2.

Next, using FIG. 5, descriptions will be provided for how the switching circuit of the embodiment works. FIG. 5 shows waveforms of voltages and currents in the switching circuit of the embodiment. FIG. 5(a) shows the waveform of an output voltage from the gate driver circuit 13; FIG. 5(b) shows the waveform of an output voltage from the gate driver circuit 23; FIG. 5(c) shows the waveform of a voltage between the gate and the source of the switching element Q1; FIG. 5(d) shows the waveform of a voltage between the gate and the source of the switching element Q2; FIG. 5(e) shows the waveform of a voltage between the drain and the source of the switching element Q1; FIG. 5(f) shows the waveform of a current of the upper arm circuit 1041; FIG. 5(g) shows the waveform of a voltage between the drain and the source of the switching element Q2; and FIG. 5(h) shows the waveform of a current of the lower arm circuit 1042. The timings of the illustrated waveforms are synchronized with one another. Here, the direction of each load current outputted to the AC terminal 3 in FIG. 2 is defined such that the direction in which the current is outputted from the AC terminal is positive. The timings of the positive pulses outputted from the gate driver circuits 13, 23, shown in FIGS. 5(a) and 5(b), are the same as the timings shown in FIGS. 4(a) and 4(b), respectively. For this reason, descriptions for their timings will be omitted.

Once the positive pulse is outputted from the gate driver circuit 13 at time T1, the voltage between the gate and the source of the switching element Q1 rises. At time Ta, the voltage between the gate and the source of the switching element Q1 reaches the threshold voltage, and the switching element Q1 turns on. At this time, the drain current of the switching element Q1 starts to flow, and the voltage between the drain and the source of the switching element Q1 drops. In response to the drop in the voltage between the drain and the source of the switching element Q1, the voltage between the drain and the source of the switching element Q2 rises. During this time, the negative bias voltage is outputted from the gate driver circuit 23.

At the time Ta, migration of charges occurs in a passage passing through the feedback capacitance 26 and the input capacitance 27 due to the rise in the voltage between the drain and the source of the switching element Q2. Accordingly, the voltage between the gate and the source of the switching element Q2 rises. Meanwhile, in the embodiment, a passage is formed from the gate electrode of the switching element Q2 to the output terminal of the gate driver circuit 23 via the emitter electrode and the base electrode of the switching element 24. Accordingly, the current occurring due to the rise in the voltage between the gate and the source of the switching element Q2 flows in this passage, and the switching element 24 turns on. Once the switching element 24 turns on, the capacitor 25 becomes connected between the gate and the source of the switching element Q2 in parallel. For this reason, the rise in the voltage between the gate and the source of the switching element Q2 is suppressed, and the voltage between the gate and the source of the switching element Q2 which reaches a peak at a point of time Tb is kept lower than the threshold voltage. Thereby, the false triggering of the switching element 22 can be prevented. In the series of operations, the change in the voltage of the terminal of the capacitor 25 is small. Accordingly, the current of the capacitor 25 hardly becomes a burden to the gate driver circuit 23.

Figure 6:
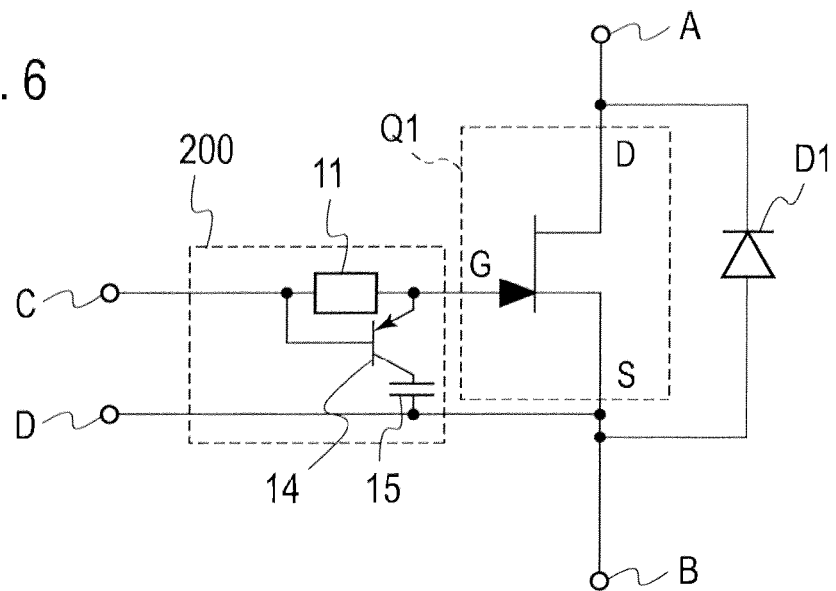
FIG. 6 is a circuit diagram showing the upper arm circuit shown in FIG. 2, from which the representations of a gate driver circuit and a gate impedance are omitted.
Figure 7:
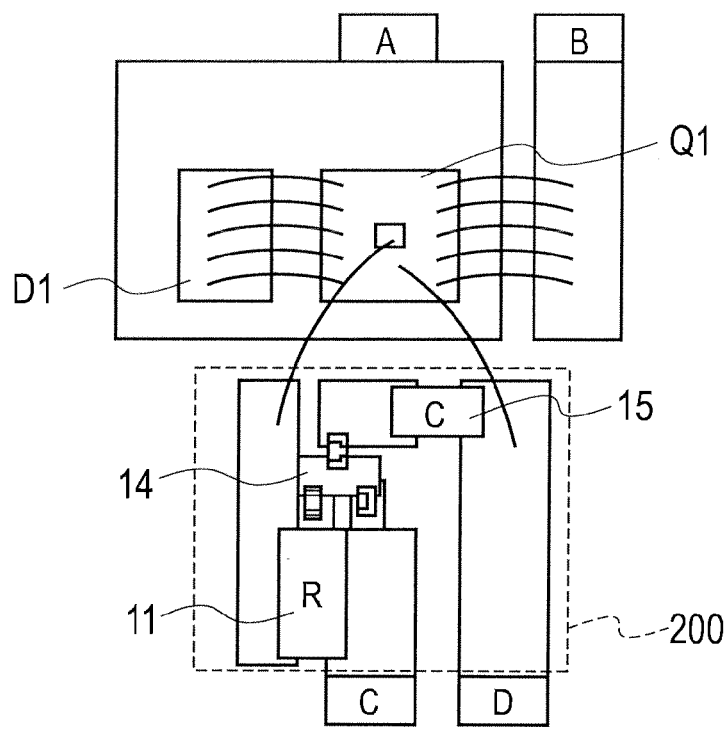
FIG. 7 is a plan view of an inner structure of a semiconductor module in which specific chips in the circuit diagram shown in FIG. 6, such as agate resistor, a switching element and a capacitor are arranged on wiring patterns of a hoard.

Next, using FIG. 6 and FIG. 7, descriptions will be provided for the inner structure of a semiconductor module in which the switching circuit of the embodiment is incorporated. FIG. 6 is a circuit diagram of the upper arm circuit 1041 extracted from FIG. 2, from which the representations of the gate driver circuit 13 and the gate impedance 12 are removed. The gate impedance 12 whose main component is an inductance exists in the wiring from the gate electrode G of the first switching element Q1 to the gate driver circuit 13, and accordingly makes the operation of the circuit of the present invention become slower. For this reason, the second switching element 14, the first capacitor 15 and the like need to be arranged immediately near the first switching element Q1. FIG. 7 is a plan view of the inner structure of the semiconductor module, showing how actual chips are arranged on the wiring patterns of the board in the module for the purpose of materializing the circuit shown in FIG. 6. An area 200 surrounded by a dotted line represents an added portion in which the second switching element 14, the first capacitor 15 and the resistor 11 are laid out in a compact arrangement. The switching element Q1 and the diode D1 are mounted on a wiring pattern, formed on the board (not illustrated) and including a terminal A, with their backside electrodes electrically connected to the wiring pattern by use of solder or the like. The low-potential electrodes on the front surfaces of the switching element Q1 and the diode D1 are electrically connected to a wiring including a terminal B by use of aluminum wires as shown in the drawing. The gate resistor 11, the switching element 14 and the capacitor 15 are mounted while lying over four wiring patterns as shown in the drawing, and constitute the added portion 200 in FIG. 6. In this manner, the circuit in the added portion shown in FIG. 6 can be materialized immediately near the switching element Q1 in the actual module compactly. It should be noted that the elements included in each of the other upper arm circuits 1043, 1045 and the lower arm circuits 1042, 1044, 1046 are similarly constructed as a module. Since these modules are identical to the module of the upper arm circuit 1041, descriptions for the modules will be omitted.

Meanwhile, a configuration may be employed in which only the added portion 200 is constructed as a module and is added to a module including only the switching element Q1 and the diode D1.

As described above, the embodiment employs, for example, the circuit configuration as shown in FIG. 2, in which: the capacitors 15, 25 and the switching elements 14, 24 are connected together in series between the gate electrodes and the source electrodes of the switching elements Q1, Q2, respectively; the emitter electrodes of the switching elements 14, 24 are connected to the gate electrodes G of the switching elements Q1, Q2, respectively; the collector electrodes of the switching elements 14, 24 are connected to the one electrodes of the capacitors 15, 25, respectively; the other electrodes of the capacitors 15, 25 are connected to the source electrodes S of the switching elements Q1, Q2, respectively; and the base electrodes of the switching elements 14, 24 are connected between the gate resistors 11, 21 and the gate driver circuits 13, 23, respectively. Thereby, the embodiment prevents false triggering when, for example, in response to the turning on of the switching element Q1, the voltage would otherwise rise between the gate and the source of the other switching element Q2, because the migrating charges which would otherwise raise the potential of the gate electrode is made to flow to the gate driver circuit 23 via the emitter and the base of the switching element 24. Thereafter, the switching element 24 turns on and the gate terminal of the switching element Q2 is conducted with the capacitor 25. Accordingly, the equivalent input capacitance becomes larger. This suppresses the rise in the voltage between the gate and the source of the switching element Q2, and the false triggering of the switching element Q2 can be prevented. It should be noted that the operation for preventing the false triggering of the switching element Q1 is similarly performed when the switching element Q2 turns off while the switching element Q1 is in the OFF state. Furthermore, the similar applies when the configuration is as shown in FIG. 1.

Moreover, in the embodiment using the configuration as shown in FIG. 2, the capacitors 15, 25 are connected for the purpose of preventing the false triggering by applying a bias voltage between the gates and the sources of the switching elements Q1, Q2, respectively. For this reason, the capacitors 15, 25 need not be discharged each time the respective gate driver circuits 13, 23 perform the switching control. Since the capacitors 15, 25 need not be charged or discharged each time the switching control is performed, the embodiment is capable of: reducing loads on the gate driver circuit 13, 23; preventing the output waveforms of the gate driver circuits 13, 23 from becoming blunt; preventing the occurrence of a delay in the switching operation; and preventing a decrease in the switching speed.

What is more, the embodiment similarly functions in a case where: a wide gap semiconductor device whose threshold voltage between the gate and the source is set to a negative voltage is used as each of the switching elements Q1, Q2; and in response to the turning on of the switching element Q1, the voltage would otherwise rise between the gate and the source of the switching element Q2, and the switching element 24 would otherwise turn on accordingly.

It should be noted that when the embodiment uses the configuration as shown in FIG. 1, a bipolar transistor may be used as each of the switching elements Q1 to Q6 by connecting the collector electrode, the emitter electrode and the base electrode in such a manner to serve as the high potential-side electrode, the low potential-side electrode and the control electrode, respectively. Instead, when the embodiment uses the configuration as shown in FIG. 2, a P-channel field effect transistor may be used as each of the switching elements 14, 24 by connecting the source electrode, the drain electrode and the gate electrode in such a manner to serve as the high potential-side electrode, the low potential-side electrode and the control electrode, respectively.

In other words, when using the configuration as shown in FIG. 2, the switching circuit of the embodiment includes: the resistors 11, 21 connected between the gate electrodes or the base electrodes of the switching elements Q1, Q2 and the driver circuits 13, 23 configured to control the switching gates Q1, Q2, respectively; the capacitors 15, 25 connected between the gate electrodes or the base electrodes of the switching elements Q1, Q2 and the source electrodes or the emitter electrodes of the switching elements Q1, Q2, respectively; and the switching elements 14, 24 connected to the capacitors 15, 25 in series, respectively. The emitter terminals or the source terminals of the switching elements 14, 24 are connected to the gate electrodes or the base electrodes of the switching elements Q1, Q2, respectively. The collector terminals or the drain terminals of the switching elements 14, 24 are electrically connected to the source electrodes or the emitter electrodes of the switching elements Q1, Q2, respectively. The base electrodes or the gate electrodes of the switching elements 14, 24 are connected between the resistors and the control circuits, respectively. Each of the switching elements 14, 24 may be formed from a PNP transistor or a P-channel field effect transistor.

Furthermore, in the embodiment, although the capacitors 15, 25 are respectively connected to the collector electrodes of the switching elements 14, 24, ends of the capacitors 15, 25 may be respectively connected to the emitter terminals of the switching elements 14, 24, while the other ends of the capacitors 15, 25 may be respectively connected to the gate terminals of the switching elements Q1, Q2.

Each of the switching elements Q1, Q2 corresponds to a "first switching element" in the claims of the present invention; each of the switching elements 14, 24 corresponds to a "second switching element" therein; each of the capacitors 15, 25 corresponds to a "first capacitor" therein; each of the gate driver circuits 13, 23 corresponds to a "control circuit" therein; and the gate resistor 11 corresponds to a "resistor" therein.

Second Embodiment

Figure 8:
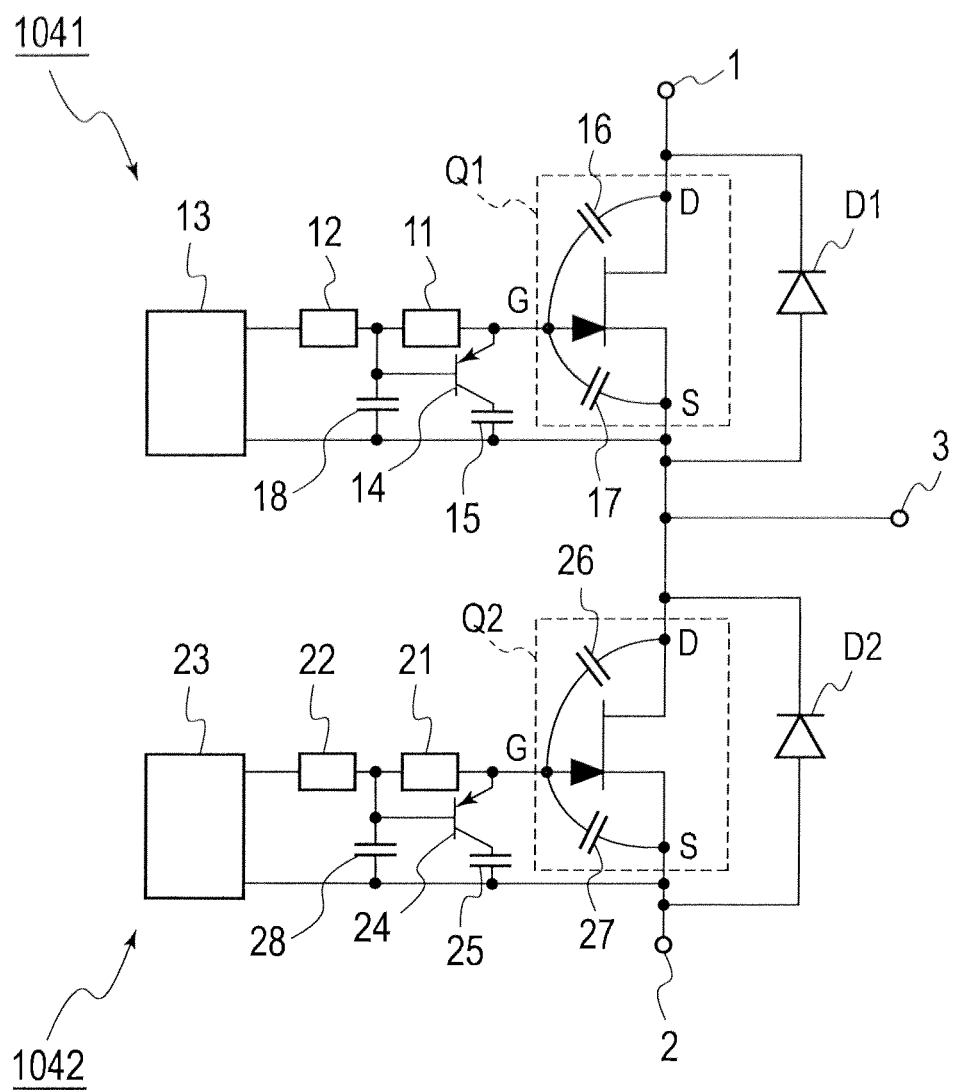
FIG. 8 is a circuit diagram showing upper and lower arm circuits constituting a switching circuit of a second embodiment of the present invention.

FIG. 8 is a circuit diagram of a circuit in the U-phase which is extracted from an inverter including a switching circuit of a second embodiment of the present invention. This embodiment is different from the first embodiment in that a capacitor 18 and a capacitor 28 are connected. The rest of the configuration is the same as that of the above-described first embodiment. For this reason, descriptions for the rest of the configuration will be omitted.

In the switching circuit of this embodiment, the capacitor 18 is connected between the base and the collector of the switching element 14, while the capacitor 28 is connected between the base and the collector of the switching element 24. Descriptions will be hereinbelow provided for the functions of the respective capacitors 18, 28.

Once the switching element Q1 turns on and the voltage rises between the gate and the source of the switching element Q2, a current from the gate electrode flows to the capacitor 28 via the emitter and the base of the switching element 24. Thus, the switching element 24 turns on, and the series circuit including the switching element 24 and the capacitor 25 is conducted between the gate and the source of the switching Q2. Accordingly, a rise in the voltage between the gate and the source of the switching element Q2 is suppressed. In this embodiment, the base current of the switching element 24 is made to flow to the capacitor 28 instead of the gate impedance 22. For this reason, it is possible to make the base current less likely to be influenced by the gate impedance 22. The capacitances of the capacitors 18, 28 may be smaller than the capacitances of the capacitors 15, 25 by one digit or more.

Figure 9:
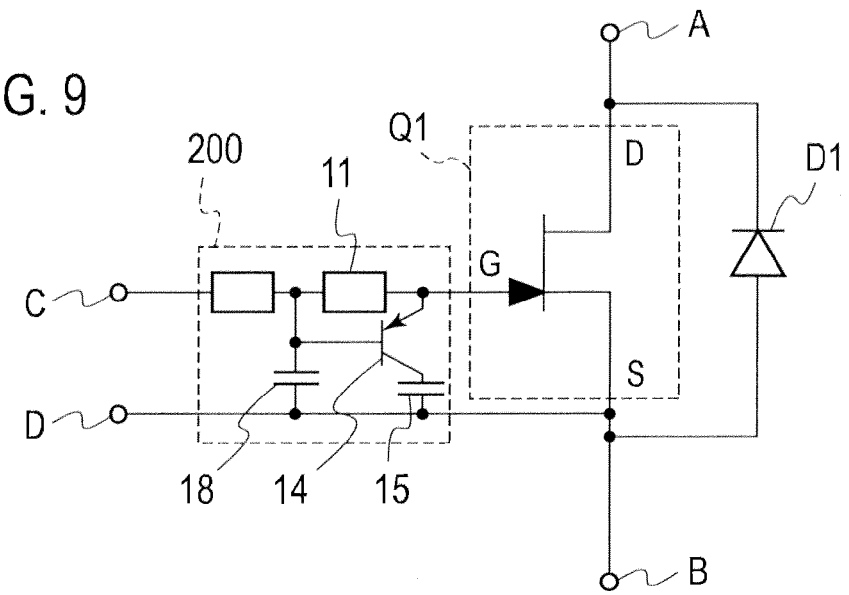
FIG. 9 is a circuit diagram showing the upper arm circuit shown in FIG. 8, from which the representations of a gate driver circuit and agate impedance are omitted.
Figure 10:
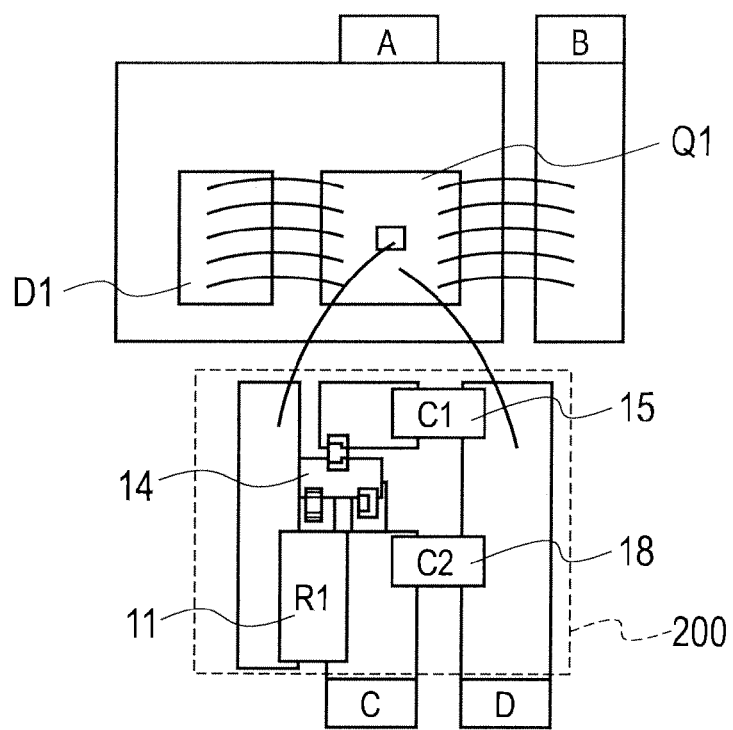
FIG. 10 is a plan view of an inner structure of a semiconductor module obtained by: arranging specific chips in the circuit diagram shown in FIG. 9, such as a gate resistor, a switching element and a capacitor on wiring patterns of a board; and packaging them into a module.

Next, using FIG. 9 and FIG. 10, descriptions will be provided for the embodiment. FIG. 9 is a circuit diagram of the upper arm circuit 1041 extracted from FIG. 8, from which the representation of the gate driver circuit 13 is removed. The gate impedance 12 whose main component is an inductance exists in the wiring from the gate electrode G of the first switching element Q1 to the gate driver circuit 13, and accordingly makes the operation of the circuit of the present invention become slower. For this reason, the second switching element 14, the first capacitor 15 and the like need to be arranged immediately near the first switching element Q1. FIG. 10 is a plan view of the inner structure of the semiconductor module, showing how actual chips are arranged on the wiring patterns of the board in the module for the purpose of materializing the circuit shown in FIG. 9. The area 200 surrounded by a dotted line represents an added portion in which the second switching element 14, the first capacitor 15, the resistor 11 and the second capacitor 18 are laid out in a compact arrangement. It should be noted that the elements included in each of the other upper arm circuits 1043, 1045 and the lower arm circuits 1042, 1044, 1046 are similarly constructed as a module. Since these modules are identical to the module of the upper arm circuit 1041, descriptions for the modules will be omitted.

As described above, in this embodiment, the capacitors 18, 28 whose capacitances are smaller than the capacitances of the capacitors 15, 25 are connected between the base electrodes and the collector electrodes of the switching elements 14, 24, respectively. This makes it possible to prevent the base currents of the switching elements 14, 24 from being forced to flow less due to the gate impedances 12, 22.

Each of the capacitors 18, 28 corresponds to a "second capacitor" in the claims of the present invention.

Third Embodiment

Figure 11:
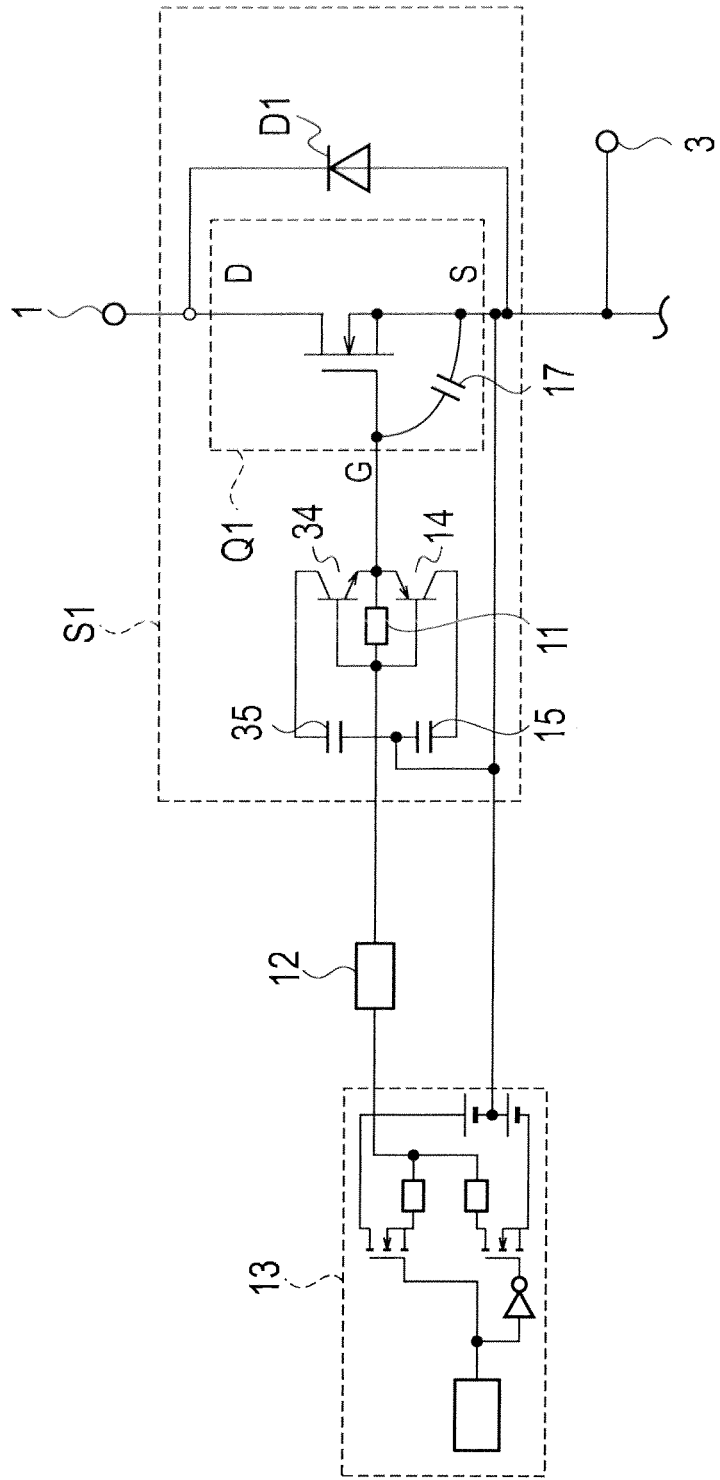
FIG. 11 is a circuit diagram showing an upper arm circuit in a switching circuit of a third embodiment of the present invention.

Using FIG. 11, descriptions will be provided for a switching circuit of a third embodiment of the present invention. FIG. 11 is a circuit diagram of the upper arm circuit 1041 in the U-phase which is extracted from the inverter 100 shown in FIG. 1. The upper arm circuit of this embodiment further includes a switching element 34 and a capacitor 35 compared with the upper arm circuit 1041 shown in FIG. 2. The rest of the configuration is the same as that of the upper arm circuit 1041 shown in FIG. 2. It should be noted that the configuration of the lower arm circuit 1042 in the U-phase of this embodiment is the same as that of the upper arm circuit in the U-phase shown in FIG. 11. In addition, the circuit configurations of the upper arm circuit 1043 and the lower arm circuit 1044, as well as the circuit configurations of the upper arm circuit 1045 and the lower arm circuit 1046, which are shown in FIG. 1, are the same as those of the upper arm circuit 1041 and the lower arm circuit 1042 of this embodiment. For this reason, descriptions for the circuit configurations of the circuits 1043 to 1046 will be omitted.

The upper arm circuit of this embodiment includes the gate driver circuit 13, the gate impedance 12 and a semiconductor module S1. The semiconductor module S1 is the switching circuit of the third embodiment of the present invention which is formed into a module.

The gate driver circuit 13 generates a rectangular-waveform voltage for driving the semiconductor module S1 as a control signal, and outputs the control signal to the semiconductor module S1.

The gate impedance 12 is set for the sake of convenience in explaining the circuit operation. The gate impedance 12 includes: the internal impedance of the gate driver circuit 13; and the impedance of the gate wiring for connecting the gate driver circuit 13 and the semiconductor module S1. The main component of the gate impedance 12 is a wiring inductance.

The semiconductor module S1 includes: the capacitor 35; the capacitor 15; the switching element 34 configured to assist the turning on; the switching element 14 configured to assist the turning off; the gate resistor 11; the switching element Q1; the diode D1; the positive electrode terminal 1; and the negative electrode terminal. The negative electrode terminal is connected to the AC terminal 3 and the drain electrode of the switching element Q2, which is not illustrated. The input capacitance 17 parasitically exists between the gate and the source of the switching element Q1. The input capacitance 17 becomes larger in proportion to the chip size of the switching element Q1.

One end of the capacitor 35 is connected to the collector of the switching element 34, while the other end of the capacitor 35 is connected to one end of the capacitor 15. The other end of the capacitor 15 is connected to the collector of the switching element 14. The connecting point between the capacitor 35 and the capacitor 15 is connected to the source of the switching element Q1. Each of the capacitor 35 and the capacitor 15 has a capacitance which is sufficiently (more than 10 times, for example) larger than the input capacitance 17.

The switching element 34 is formed from a NPN transistor. The emitter of the switching element 34 is connected to the connecting point between the gate of the switching element Q1 and the gate resistor 11, while the base of the switching element 34 is connected to the connecting point between the output terminal of the gate driver circuit 13 and the gate resistor 11. The switching element 34 has a function of charging the input capacitance 17 by feeding a current from the capacitor 35 to the input capacitance 17, and additionally a function of charging the capacitor 35. To put it specifically, the capacitor 35 is charged with a positive voltage via the PN junction between the base and the collector of the switching element 34 when the positive voltage is sent from the gate driver circuit 13 to the capacitor 35.

The switching element 14 is formed from a PNP transistor. The emitter of the switching element 14 is connected to the connecting point between the gate of the switching element Q1 and the one terminal of the gate resistor 11, while the base of the switching element 14 is connected to the connecting point between the other terminal of the gate resistor 11 and the output terminal of the gate driver circuit 13. The switching element 14 has a function of charging and discharging the input capacitance 17 by feeding a current from the input capacitance 17 to the capacitor 15, and additionally a function of charging the capacitor 15. To put it specifically, the capacitor 15 is charged with a negative voltage via the NP junction between the base and the collector of the switching element 14, when the negative voltage is sent from the gate driver circuit 13 to the capacitor 15.

The gate resistor 11 is a resistor configured to prevent parasitic oscillation in the switching element Q1. The one end of the gate resistor 11 is connected to the output terminal of the gate driver circuit 13, while the other end of the gate resistor 11 is connected to the gate of the switching element Q1.

The switching element Q1 conducts between the drain and the source when the voltage between the gate and the source is equal to or greater than a threshold voltage. The switching element Q1 disconnects the drain and the source when the voltage between the gate and the source is less than the threshold voltage. The threshold voltage is a value inherent to the switching element Q1. It should be noted that although FIG. 11 shows a MOS field effect transistor (MOSFET) as the switching element Q1, an insulated gate bipolar transistor (IGBT) may be used as the switching element Q1 instead.

The diode D1 is provided between the drain electrode and the source electrode of the switching element Q1. The cathode of the diode D1 is connected to the drain electrode of the switching element Q1, while the anode of the diode D1 is connected to the source electrode of the switching element Q1.

In addition, the positive electrode terminal 1 is drawn out from the drain of the switching element Q1, while the negative electrode terminal is drawn out from the source of the switching element Q1. The positive electrode terminal 1 is connected to the positive electrode side of the DC power source 101 shown in FIG. 1, while the negative electrode terminal is connected to the U-phase of the AC load 103 shown in FIG. 1 via the AC terminal 3.

Figure 12:
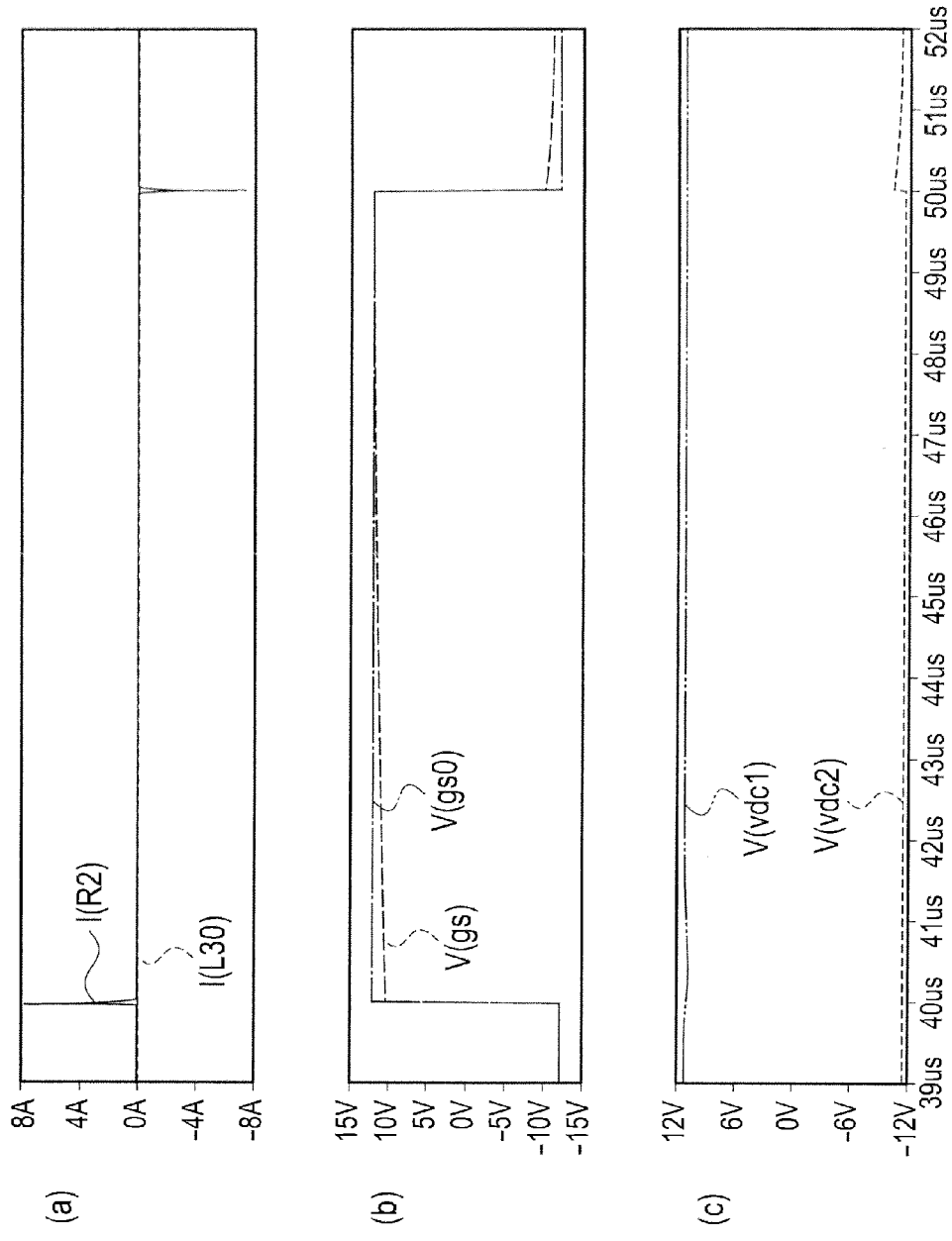
FIGS. 12(a) to 12(c) are graphs showing time characteristics of voltages and currents in the upper arm circuit shown in FIG. 11.

Next, referring to waveform charts shown in FIGS. 12(a) to 12(c), descriptions will be provided for how the upper arm circuit shown in FIG. 11 performs the switching operation. FIG. 12 shows the waveforms of some voltages and currents in the circuit shown in FIG. 11. FIG. 12(a) shows the waveform of a charge current I(R2) of the input capacitance 17 and the waveform of a current I(L30) of the gate driver circuit 13; FIG. 12(b) shows the waveform of a signal voltage V(gs0) outputted from the gate driver circuit 13 and the waveform of a signal voltage V(gs) applied to the gate of the switching element Q1; and FIG. 12(c) shows the waveform of a terminal voltage V(vdc1) of the capacitor 35 and the waveform of a terminal voltage V(vdc2) of the capacitor 15. The timings of the illustrated waveforms are synchronized with one another.

While the signal voltage V(gs0) outputted from the gate driver circuit 13 is negative, the terminal voltage of the input capacitance 17 is negative as well. As shown in FIG. 12(b), once the signal voltage V(gs0) outputted from the gate driver circuit 13 changes from negative to positive during this state, a terminal voltage in the forward direction is generated at the gate resistor 11. In response to this, a positive voltage is applied between the base and the emitter of the switching element 34, and the switching element 34 accordingly turns on. Thereby, a current flows from the capacitor 35 to the input capacitance 17, and the input capacitance 17 is charged. The charging is not influenced by the gate impedance 12, because the current does not pass through the gate wiring. The switching element 34 has a threshold value for turning on based on a potential difference which occurs between the two ends of the gate resistor 11 in the process of a negative-to-positive change in the voltage applied to the gate electrode of the switching element Q1.

Furthermore, since the current of the gate driver circuit 13 is a sum of the current of the gate resistor 11 and the base current of the switching element 34, a peak value of the current of the gate driver circuit 13 is smaller than the charging and discharging currents of the capacitor 35.

Once the signal voltage V(gs0) outputted from the gate driver circuit 13 changes from positive to negative, a terminal voltage in the reverse direction is generated at the gate resistor 11. In response to this, a negative voltage is applied between the base and the emitter of the switching element 14, and the switching element 14 accordingly turns on. The switching element 14 has a threshold value for turning on based on a potential difference which occurs between the two ends of the gate resistor 11 in the process of a positive-to-negative change in the voltage applied to the gate electrode of the switching element Q1. Thereby, a current flows from the capacitor 15 to the input capacitance 17, and the input capacitance 17 is charged. This charging is not influenced by the gate impedance 12 either since the current does not pass through the gate wiring.

It should be noted that a semiconductor switch with a larger DC current amplification factor (hfe) is used as each of the switching element 34 and the switching element 14. This makes it possible to feed a larger current to the switching element Q1. For this reason, it is possible to reduce time to charge and discharge the input capacitance 17, to shorten a delay in the switching operation of the switching element Q1, and concurrently to increase the switching speed. Consequently, it is possible to provide the switching circuit and the semiconductor module which are excellent in readiness.

According to a result of measuring a prototype circuit, the peak value of the charging current I(R2) shown in FIG. 12(a) was 7 A, for example; and the current I(L30) of the gate driver circuit 13 was 300 mA, for example.

As shown in FIG. 12(a), the peak current I(L30) of the gate driving circuit 13 is smaller than that in a second comparative example (see FIG. 16(a)), which is described later. In addition, as shown in FIG. 12(b), when the voltage V(gs) applied to the gate of the switching element Q1 changes from negative to positive, the capacitor 35 is discharged but the terminal voltage V(vdc1) of the capacitor 35 just becomes slightly lower at around time 41 μs as shown in FIG. 12(c). On the other hand, when the voltage V(gs) applied to the gate of the switching element Q1 changes from positive to negative, the capacitor 15 is discharged and the terminal voltage V(vdc2) of the capacitor 15 became slightly higher at around time 50 μs as shown in FIG. 12(c).

As described above, the switching circuit and the semiconductor module of the third embodiment charge and discharge the input capacitance 17 through the shortest passages. For this reason, time periods for a rise and a fall in the voltage V(gs) applied to the gate can be made shorter than in the case of the waveforms (see FIG. 16(b)) of the second comparative example. Furthermore, it is possible to reduce a delay in time required for the switching element Q1 to start the switching operation after the activation of the gate driver circuit 13.

In this embodiment, the capacitors 15, 35 are connected to the collector electrodes of the switching elements 14, 34, respectively. Instead, however, the one ends of the capacitors 15, 35 may be connected to the emitter terminals of the switching elements 14, 34, while the other ends of the capacitors 15, 35 may be connected to the gate terminal of the switching element Q1.

The switching element 34 and the capacitor 35, which have been described, correspond to a "third switching element" and a "third capacitor" in the claims of the present invention.

Fourth Embodiment

Figure 13:
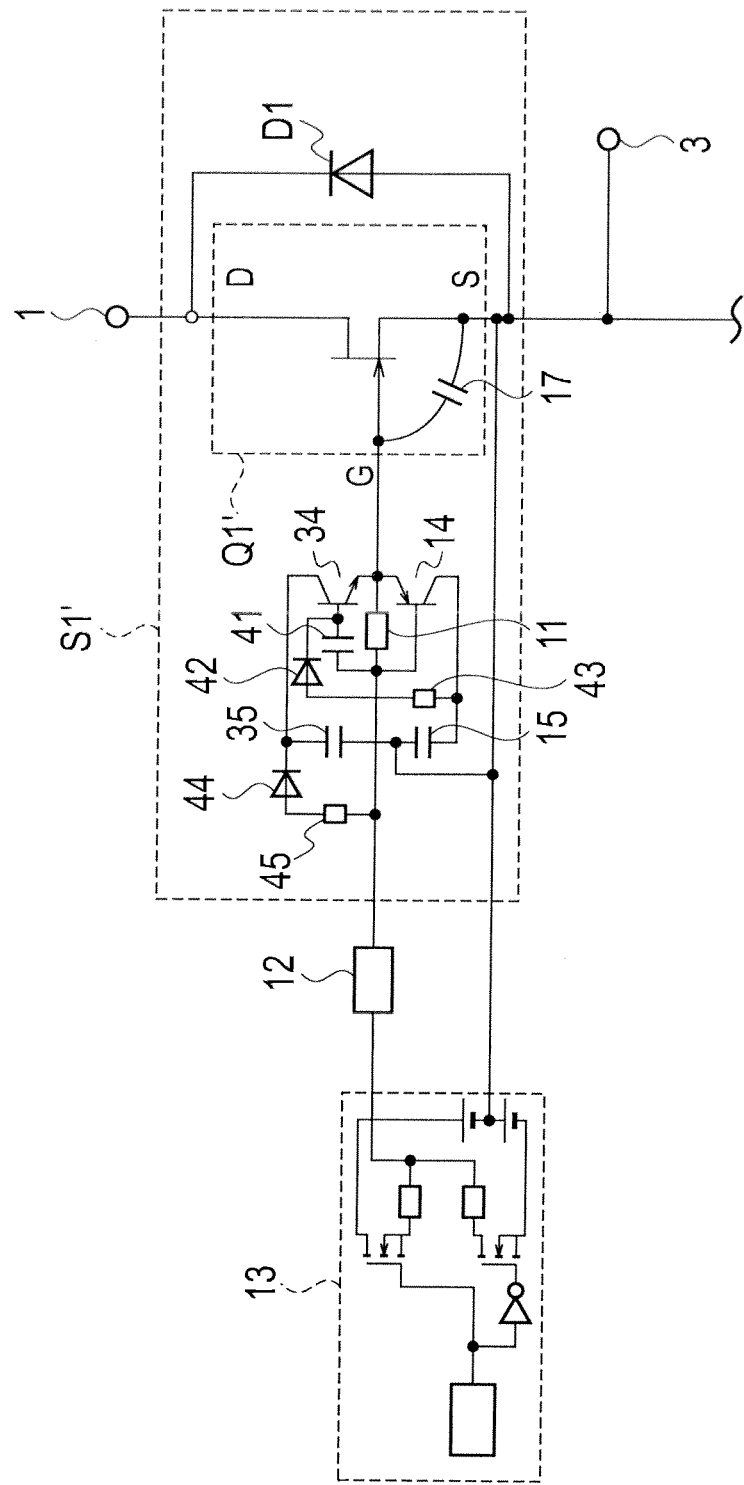
FIG. 13 is a circuit diagram showing an upper arm circuit in a switching circuit of a fourth embodiment of the present invention.

Using FIG. 13, descriptions will be provided for a detailed configuration of an upper arm circuit included in a switching circuit of this embodiment. FIG. 13 is a circuit diagram of an upper arm circuit 1041 in the U-phase which is extracted from the inverter 100 shown in FIG. 1. The upper arm circuit shown in FIG. 13 includes the gate driver circuit 13, the gate impedance 12 and a semiconductor module S1'. The semiconductor module S1' shown in FIG. 13 further includes a capacitor 41, a diode 42, a resistor 43, a diode 44 and a resistor 45 compared with the semiconductor module S1 shown in FIG. 11. In addition, a switching element Q1' is formed from a junction field effect transistor (JFET). The rest of the configuration is the same as that of the upper arm circuit shown in FIG. 11. Descriptions will be hereinbelow provided mainly for what is different from the third embodiment.

The capacitor 41 is provided between the base of the switching element 34 and the connecting point between the gate resistor 11 and the gate driver circuit 13. One electrode of the capacitor 41 is connected to the base of the switching element 34, while the other electrode of the capacitor 41 is connected to an electrode of the gate resistor 11, which is connected to the gate driver circuit 13. The provision of the capacitor 41 makes it possible to cause the switching element 34 to operate in such a way to be conducted (turn on) only during the transition to the turning on of the switching element Q1'.

One end of the resistor 45 is connected to the connecting point between the gate resistor 11 and the output terminal of the gate driver circuit 13, while the other end of the resistor 45 is connected to the anode of the diode 44. The cathode of the diode 44 is connected to the connecting point between the collector of the switching element 34 and the capacitor 35. The resistor 45 and the diode 44 function as a charging circuit configured to positively charge the capacitor 35.

One end of the resistor 43 is connected to the connecting point between the collector of the switching element 14 and the capacitor 15, while the other end of the resistor 43 is connected to the anode of the diode 42. The cathode of the diode 42 is connected to the connecting point between the base of the switching element 34 and the capacitor 41. The resistor 43 and the diode 42 function as a discharging circuit configured to discharge the capacitor 41.

Figure 14:
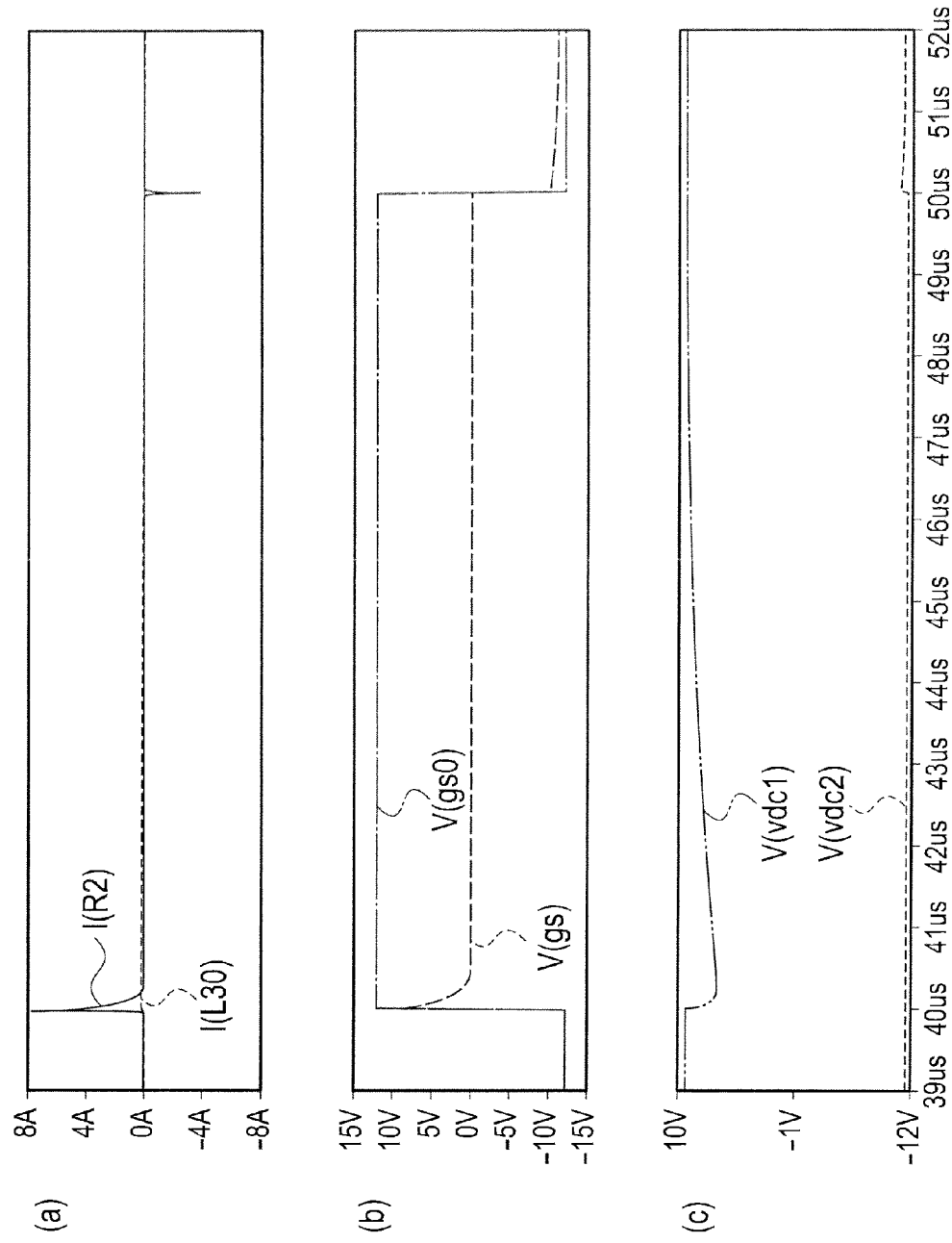
FIGS. 14(a) to 14(c) are graphs showing time characteristics of voltages and currents in the upper arm circuit shown in FIG. 13.

Next, referring to waveform charts shown in FIGS. 14(a) to 14(c), descriptions will be provided for how the upper arm circuit shown in FIG. 13 performs the switching operation. In FIG. 14(a), reference sign I(R2) denotes a sum of the gate current of the JFET and the charging current of the input capacitance 17, and reference sign I(L30) denotes the current of the gate driver circuit 13.

A turning-off operation for changing the signal voltage V(gs0) outputted from the gate driver circuit 13 from positive to negative (an operation at around time 50 μs in FIG. 14) is the same as the operation which has been described by referring to FIG. 11 and FIG. 12. For this reason, description for the turning-off operation will be omitted.

A turning-on operation to be performed when the signal voltage V(gs0) outputted from the gate driver circuit 13 changes from negative to positive is achieved as follows. As shown in FIG. 14(b), once the signal voltage V(gs0) outputted from the gate driver circuit 13 changes from negative to positive, a current in the forward direction is generated at the gate resistor 11.

At this time, a current flows to the base of the switching element 34 via the capacitor 41, and the switching element 34 is thereby conducted. Thus, a current is supplied from the capacitor 35 to the gate of the switching element Q1'. Once the terminal voltage of the capacitor 41 becomes equal to or greater than a certain value as a result of the charging of the capacitor 41, the base current of the switching element 34 stops its flow. For this reason, the switching element 34 turns off. The capacitor 35 which has been discharged via the switching element 34 is charged by the resistor 45 and the diode 44.

The capacitor 41 is discharged via the capacitor 41, the diode 42, the gate resistor 43, the capacitor 15 and the gate driver circuit 13 while the voltage V(gs0) outputted from the gate driver circuit 13 is negative.

Figure 16:
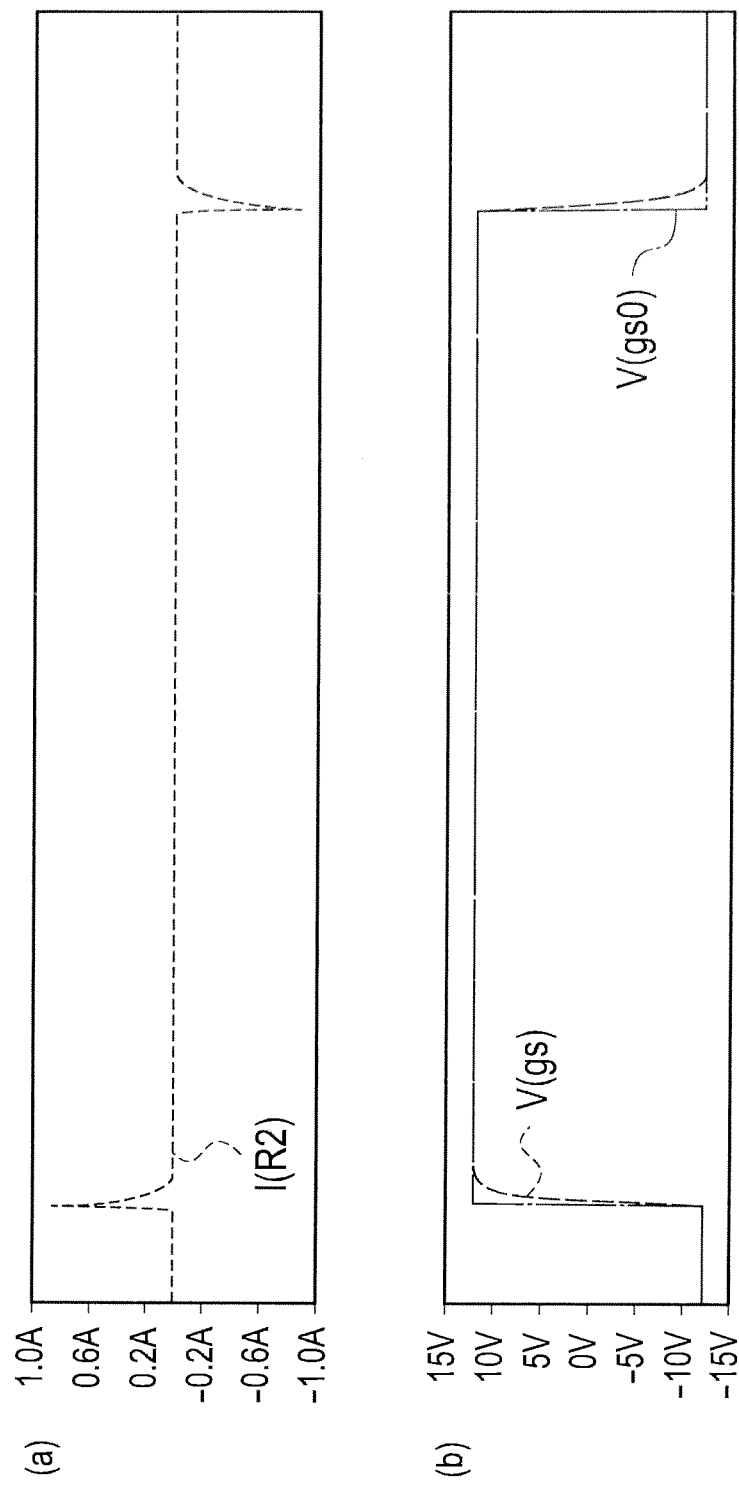
FIGS. 16(a) to 16(b) are graphs showing time characteristics of voltages and a current in the upper arm circuit shown in FIG. 15.

As shown in FIG. 14(a), the peak current I(L30) of the gate driver circuit 13 is smaller than its counterpart of the second comparative example shown in FIG. 16. Furthermore, as shown in FIG. 14(b), when the voltage V(gs) applied to the gate of the switching element Q1' changes from negative to positive, the capacitor 35 is discharged and the terminal voltage V(vdc1) of the capacitor 35 becomes slightly lower at around time 41 μs as shown in FIG. 14(c). On the other hand, when the voltage V(gs) applied to the gate of the switching element Q1' changes from positive to negative, the capacitor 15 is discharged and the terminal voltage V(vdc2) of the capacitor 15 becomes slight higher at around time 51 μs as shown in FIG. 14(c).

As described above, when the switching element Q1' turns on, the semiconductor module of the fourth embodiment feeds a sufficient pulse current as the gate current I(R2) to the gate of the switching element Q1' as shown in FIG. 14(a). In addition, at this time, the peak current I(L30) of the gate driver circuit 13 is very small. The rate of change between the gate and the source of the switching element Q1' is thus improved.

As described above, the fourth embodiment of the present invention suppresses the peak current I(L30) of the gate driver circuit 13, and is accordingly capable of reducing the load on the gate driver circuit 13. Consequently, the size of the gate driver circuit 13 can be reduced. Moreover, since the voltage drop which occurs due to the impedance of the gate wiring existing between the gate driver circuit 13 and the semiconductor module S1' is made smaller, it is possible to suppress the influence of the impedance of the gate wiring.

What is more, since the rate of change in voltage between the gate and the source of the switching element Q1' can be made higher, it is possible to materialize the high-speed switching by the switching element Q1'.

The capacitor 41 corresponds to a "fourth capacitor"; the diode 44 and the resistor 45 correspond to a "charging circuit configured to charge the third capacitor"; and the diode 42 and the resistor 43 correspond to a "discharging circuit configured to discharge the fourth capacitor."

Second Comparative Example

Figure 15:
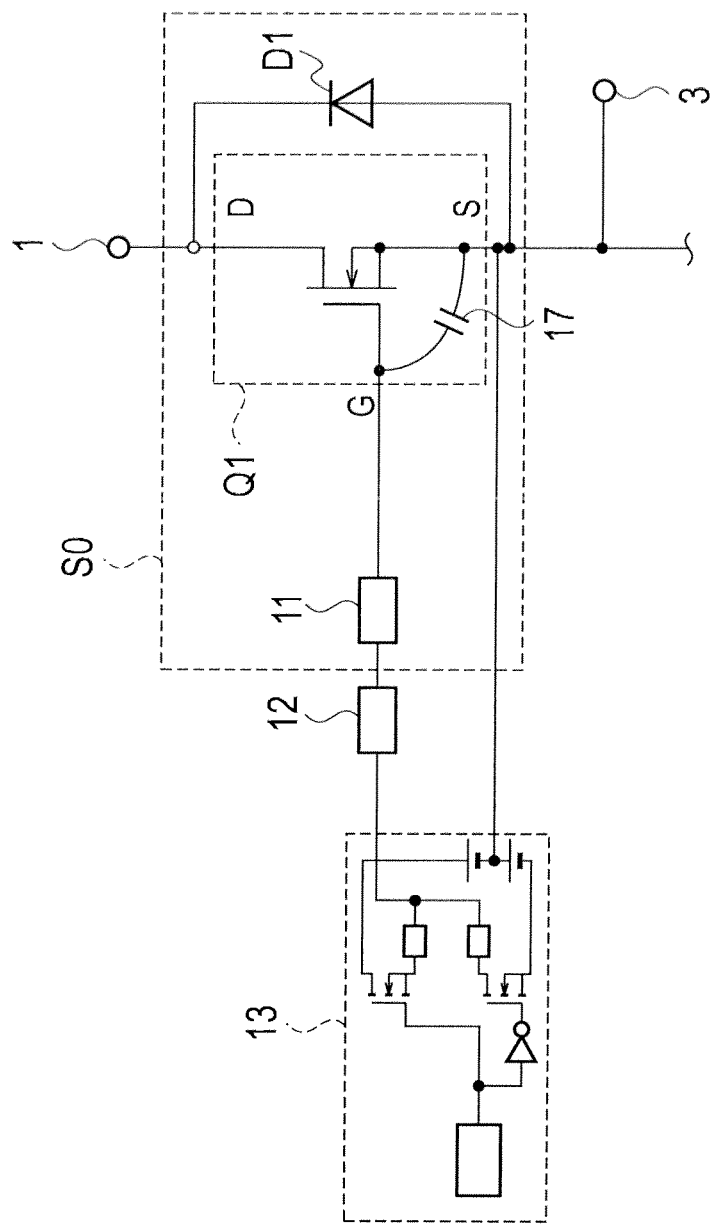
FIG. 15 is a circuit diagram showing an upper arm circuit in a switching circuit of a second comparative example.

FIG. 15 is a circuit diagram of an upper arm circuit of the second comparative example. The arm circuit of the second comparative example includes the gate driver circuit 13, the gate impedance 12 and a semiconductor module S0. The semiconductor module S0 shown in FIG. 15 does not include the switching element 14, the switching element 34, the capacitor 15 or the capacitor 35 shown in FIG. 11. The rest of the configuration is the same as that of the semiconductor module S1 shown in FIG. 11. For this reason, descriptions for the rest of the configuration will be omitted.

Next, referring to waveform charts shown in FIG. 16, descriptions will be provided for how the arm circuit of the second comparative example performs the switching operation. The gate driver circuit 13 outputs a rectangular-waveform signal voltage V(gs0) in order to switch the switching element Q1. The signal voltage V(gs0) is applied to the gate of the switching element Q1 via the gate impedance 12 and the gate resistor 11, and thus becomes a voltage V(gs) between the gate and the source of the switching element Q1. The rate of change dv/dt in the voltage V(gs) between the gate and the source is suppressed by the charging and discharging of the input capacitance 17. The rate of change in charging and discharging currents is suppressed by the gate impedance 12. For reasons, once the change in the voltage V(gs) between the gate and source is delayed, the switching speed of the switching element Q1 slows down at the same time as shown in FIG. 16(b).

At this time, as shown in FIG. 16(a), the current I(R2) of the gate driver circuit 13 has a peak current which is nearly equal to 1 A. Since this peak current needs to be fed from the gate driver circuit 13, electrical stress of the gate driver circuit 13 becomes larger and this necessity restricts a reduction in size of the gate driver circuit 13 at the same time.

Although the foregoing descriptions have been provided for the contents of the present invention on the basis of the embodiments, the present invention is not limited to what have been described, and it is obvious to those skilled in the art that various modifications and improvements can be made to the present invention.

All the contents of Japanese Patent Application No. 2011-107171 (filed on May 12, 2011) and all the contents of Japanese Patent Application No. 2011-200308 (filed on Sep. 14, 2011) are incorporated herein by reference.

INDUSTRIAL APPLICABILITY

Each of the capacitors 15, 25 is connected so as to prevent false triggering by applying the bias voltage between the gate and the source of each of the switching elements Q1 to Q6. For this reason, the capacitors 15, 25 need not be discharged each time each gate driver circuit 13, 23 performs the switching control. Since the capacitors 15, 25 need not be charged or discharge each time the switching control is performed, the embodiments are capable of: reducing the loads on the gate driver circuits 13, 23; preventing the waveforms of the outputs from the gate driver circuits 13, 23 from becoming blunt; preventing occurrence of a delay in the switching operation; and preventing a decrease in the switching speed. The switching circuit and the semiconductor module of the embodiments of the present invention are therefore industrially applicable.

REFERENCE SIGNS LIST 100 inverter
101 DC power source
102 capacitor
103 AC load
1041, 1043, 1045 upper arm circuit
1042, 1044, 1046 lower arm circuit
105 controller
Q1 to Q6, Q1' switching element
D1 to D6, 42, 44 diode
11, 21 gate resistor
12, 22 gate impedance
13, 23 gate driver circuit
14, 24, 34 switching element
15, 18, 25, 28, 35, 41 capacitor
1 positive electrode terminal
2 negative electrode terminal
3 AC terminal
200 added portion
S1, S1' semiconductor module
43, 45 resistor

The invention claimed is:

1. A switching circuit comprising:
a first switching element;
a resistor inserted between a control electrode of the first switching element and an output terminal of a control circuit configured to perform switching control on the first switching element; and
a first capacitor and a second switching element connected between the control electrode of the first switching element and a low potential-side electrode of the first switching element, wherein
a high potential-side electrode of the second switching element is connected to the control electrode of the first switching element,
a low potential-side electrode of the second switching element is connected to one electrode of the first capacitor,
the other electrode of the first capacitor is connected to the low potential-side electrode of the first switching element, and
a control electrode of the second switching element is connected to an electrode of the resistor, the electrode connected to the control circuit.

2. The switching circuit of claim 1, further comprising a second capacitor inserted between the control electrode of the second switching element and the low potential-side electrode of the first switching element, the second capacitor having a capacitance smaller than capacitance of the first capacitor.

3. The switching circuit of claim 1, wherein
the first switching element is formed from a wide gap semiconductor device, and
the wide gap semiconductor device is any one of a unipolar transistor whose high potential-side electrode serves as a drain electrode and low potential-side electrode serves as a source electrode, and a bipolar transistor whose high potential-side electrode serves as a collector electrode and low potential-side electrode serves as an emitter electrode.

4. The switching circuit of claim 1, wherein
the second switching element is any one of a PNP transistor whose high potential-side electrode serves as an emitter electrode and low potential-side electrode serves as a collector electrode, and a P-channel field effect transistor whose high potential-side electrode serves as a source electrode and low potential-side electrode serves as a drain electrode.

5. The switching circuit of claim 1, wherein a threshold voltage for switching the first switching element between an ON state and an OFF state is a negative voltage.

6. The switching circuit of claim 1, further comprising a third capacitor and a third switching element connected between the control electrode of the first switching element and the low potential-side electrode of the first switching element, wherein
  a low potential-side electrode of the third switching element is connected to the control electrode of the first switching element,
  a high potential-side electrode of the third switching element is connected to one electrode of the third capacitor,
  the other electrode of the third capacitor is connected to the low potential-side electrode of the first switching element, and
  a control electrode of the third switching element is connected to an electrode of the resistor, the electrode being connected to the control circuit.

7. The switching circuit of claim 6, wherein
the third switching element has a threshold value for turning on based on a potential difference which occurs between the two ends of the resistor in a process through which a voltage applied to the control electrode of the first switching element changes from negative to positive, and
the second switching element has a threshold value for turning on based on a potential difference which occurs between the two ends of the resistor in a process through which the voltage applied to the control electrode of the first switching element changes from positive to negative.

8. The switching circuit of claim 6, further comprising a fourth capacitor having one electrode connected to the control electrode of the third switching element and the other electrode being connected to the electrode of the resistor which is connected to the control circuit.

9. The switching circuit of claim 8, further comprising:
  a first diode and a second resistor connected between the one electrode of the fourth capacitor and the one electrode of the first capacitor, wherein the first diode and the second resistor are connected in series, an anode of the first diode is placed on the one electrode side of the first capacitor, and a cathode of the first diode is placed on the one electrode side of the fourth capacitor; and
  a second diode and a third resistor connected between the one electrode of the third capacitor and the electrode of the resistor which is connected to the control circuit, wherein the second diode and the third resistor are connected in series, an anode of the second diode is placed on the electrode side of the resistor, the electrode being connected to the control circuit, and a cathode of the second diode is placed on the one electrode side of the third capacitor.

10. A semiconductor module, wherein semiconductor chips, capacitor elements, resistor elements and metal wiring are connected and built in the semiconductor module in such a way as to materialize the switching circuit of claim 1.

* * * * *